(12) United States Patent
Ueda et al.

(10) Patent No.: US 6,451,496 B2
(45) Date of Patent: Sep. 17, 2002

(54) HEAT-CURABLE PHOTOSENSITIVE COMPOSITIONS

(75) Inventors: Takafumi Ueda; Kenji Araki; Hideto Kato, all of Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/783,216

(22) Filed: Feb. 15, 2001

(30) Foreign Application Priority Data

Feb. 16, 2000 (JP) ........................................ 2000-037369

(51) Int. Cl.$^7$ ............................................... G03F 7/023
(52) U.S. Cl. ...................... 430/190; 430/191; 430/192; 430/193; 430/280.1; 430/326; 430/330
(58) Field of Search ................................ 430/190, 165, 430/191, 192, 193, 280.1, 326, 330

(56) References Cited

U.S. PATENT DOCUMENTS

| | | | |
|---|---|---|---|
| 5,166,036 A | * 11/1992 | Seio et al. ................... | 204/507 |
| 5,183,722 A | 2/1993 | Tsutsumi et al. ............ | 430/169 |
| 5,401,604 A | * 3/1995 | Otsuka et al. ............... | 430/165 |
| 5,437,952 A | * 8/1995 | Hirai et al. .................. | 430/165 |
| 6,218,069 B1 | * 4/2001 | Kato et al. ................... | 430/190 |

FOREIGN PATENT DOCUMENTS

| | | |
|---|---|---|
| JP | 3-223702 | 10/1991 |
| JP | 7-140648 | 6/1995 |

* cited by examiner

*Primary Examiner*—John S. Chu
(74) *Attorney, Agent, or Firm*—Millen, White, Zelano & Branigan, P.C.

(57) ABSTRACT

From a heat-curable photosensitive composition comprising a cresol and/or xylenol novolac resin which has been partially 1,2-naphthoquinonediazido-4- or 5-sulfonate esterified and having a weight average molecular weight of 1,000–10,000, an epoxy compound, and a solvent therefor, a pattern featuring improved solvent resistance and heat resistance can be formed at a high sensitivity and resolution by a simple process. The pattern is suitable as an interlayer insulating film for use in thin-film magnetic heads.

1 Claim, No Drawings

HEAT-CURABLE PHOTOSENSITIVE COMPOSITIONS

This invention relates to a heat-curable photosensitive composition suitable in forming an interlayer insulating film in thin-film magnetic heads.

BACKGROUND OF THE INVENTION

In the prior art, heat-curable positive photosensitive compositions are known, for example, from JP-A 3-223702 and JP-A 7-140648. These photosensitive compositions, however, are less resistant to chemicals and heat and insufficient in resolution. There is a need for a heat-curable photosensitive composition which is improved in these properties.

SUMMARY OF THE INVENTION

An object of the invention is to provide a heat-curable photosensitive composition which when subjected to patterning exposure and heating, features a high resolution and an effective progress of curing reaction and forms a pattern having improved chemical resistance and heat resistance.

The inventor has found that blending a base-soluble resin in the form of a cresol and/or xylenol novolac resin comprising recurring units of the following general structural formula (1) which has been partially 1,2-naphthoquinonediazido-4- or 5-sulfonate esterified and having a weight average molecular weight of 1,000 to 10,000 with an epoxy compound of the following general structural formula (2) gives a heat-curable photosensitive composition which can be effectively micro-patterned through an exposure step and form, subsequent to heating, a film which is so improved in solvent resistance and heat resistance as to be suitable as an insulating film or the like.

Accordingly, the invention provides a heat-curable photosensitive composition comprising 100 parts by weight of a resin comprising recurring units of the following general structural formula (1) and having a weight average molecular weight of 1,000 to 10,000, 5 to 30 parts by weight of an epoxy compound of the following general structural formula (2), and a solvent therefor.

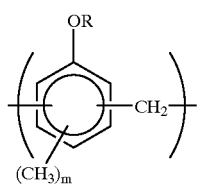

(1)

Herein R is hydrogen or a 1,2-naphthoquinonediazido-4- or 5-sulfonate residue, the proportion of the sulfonate residue being 2.5 to 27 mol % of the R groups, and m is an integer of 0 to 3.

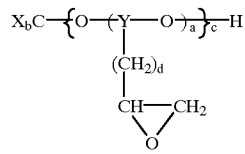

(2)

Herein X is hydrogen or an alkyl group of 1 to 6 carbon atoms, Y is a trivalent chainlike or cyclic aliphatic group of 1 to 6 carbon atoms or trivalent aromatic group of 6 to 9 carbon atoms, the letter a is a positive number of 1 to 20, each of b and c is a positive number of 1 to 3, b+c is equal to 4, and d is a number of 0 to 3.

DESCRIPTION OF THE PREFERRED EMBODIMENT

The heat-curable photosensitive composition of the invention contains a resin comprising recurring units of the following general structural formula (1).

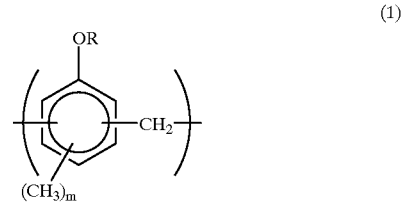

(1)

Herein R is hydrogen or a 1,2-naphthoquinonediazido-4-sulfonate or 1,2-naphthoquinonediazido-5-sulfonate residue. The proportion of the sulfonate residue is 2.5 to 27 mol %, preferably 3.0 to 20 mol % of the R groups. If the percent esterification is less than 2.5 mol %, the effect of inhibiting the dissolution of unexposed areas in a base developer becomes poor, failing to form a positive pattern. If the percent esterification is more than 27 mol %, the dissolution of exposed areas in a base developer becomes poor, resulting in a poor resolution. The letter m is an integer of 0 to 3.

The resin should have a weight average molecular weight (Mw) of 1,000 to 10,000. With a Mw of less than 1,000, the film as post-cured may be less resistant to heat. A resin with a Mw of more than 10,000 may be low in resolution and sensitivity during pattern formation.

Also contained in the photosensitive composition of the invention is an epoxy compound of the following general structural formula (2).

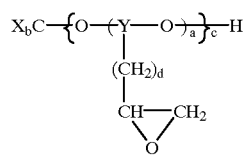

(2)

Herein X is hydrogen or an alkyl group of 1 to 6 carbon atoms such as methyl, ethyl, propyl, isopropyl, n-butyl, tert-butyl, pentyl and hexyl. Y is a trivalent chainlike or cyclic aliphatic group of 1 to 6 carbon atoms or trivalent aromatic group of 6 to 9 carbon atoms, examples of which are given below.

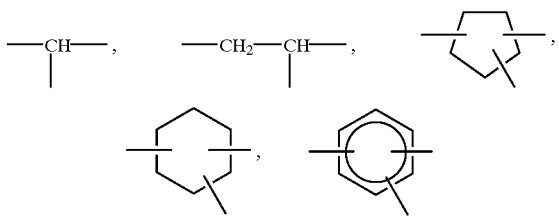

The letter a is a positive number of 1 to 20, preferably 1 to 10. Each of b and c is a positive number of 1 to 3, and b+c is equal to 4. The letter d is a number of 0 to 3.

The epoxy compound should preferably have a weight average molecular weight (Mw) of 100 to 10,000 and preferably 300 to 5,000.

The amount of the epoxy compound added is 5 to 30 parts by weight per 100 parts by weight of the resin. With less than 5 parts of the epoxy compound, the film as post-cured lacks solvent resistance and heat resistance. A composition with more than 30 parts of the epoxy compound is less effective in forming a pattern upon radiation exposure.

The heat-curable photosensitive composition is obtained by dissolving the resin and the curing agent (epoxy compound) in a suitable solvent, typically to a solid concentration of about 10 to 60% by weight. Examples of the solvent used herein include ethylene glycol monoalkyl ethers and acetates thereof, propylene glycol monoalkyl ethers and acetates thereof, diethylene glycol mono or di-alkyl ethers, alkyl lactates, alkyl alkoxypropionates, ketones such as methyl isobutyl ketone and cyclohexanone, and acetates such as butyl acetate. These solvents may be used alone or in admixture.

If desired, surfactants including nonionic, fluorochemical and silicone surfactants may be added for improving the applicability of the composition.

It is not critical how to use the heat-curable photosensitive composition in forming a resist pattern through radiation exposure. Pattern formation can be conducted by any conventional process. After the formation of a resist pattern, it is heat treated whereby a thermoset pattern is obtained.

More particularly, the composition in solution form is spin coated onto a substrate such as a silicon wafer, and prebaked thereto. The coating is exposed to ultraviolet radiation by an exposure means such as a proximity aligner or stepper, then developed and rinsed, forming the end resist pattern. The developer used herein includes aqueous solutions of inorganic bases such as sodium hydroxide and sodium carbonate and aqueous solutions of organic bases such as triethanolamine, tetramethylammonium hydroxide and choline. The thus formed resist pattern is heat treated on a hot plate or in a dryer at a temperature of about 130 to 200° C., preferably about 150 to 200° C. for about 1 to 30 minutes. This results in a thermoset pattern having improved chemical resistance and heat resistance.

There has been described a heat-curable photosensitive composition from which a pattern featuring improved solvent resistance and heat resistance can be formed at a high sensitivity and resolution by a simple process. The pattern is suitable as an interlayer insulating film for use in thin-film magnetic heads.

EXAMPLE

Examples of the invention are given below by way of illustration and not by way of limitation.

Preparation Example

A flask equipped with stirrer, nitrogen inlet tube and thermometer was charged with 124 g of a novolac resin prepared from 20 mol % of p-cresol, 50 mol % of m-cresol and 30 mol % of 3,5-xylenol and having a weight average molecular weight of 4,500, 21.5 g of 1,2-naphthoquinone-2-diazido-5-sulfonyl chloride and 500 g of 1,4-dioxane. After dissolution, 8.5 g of triethylamine was added dropwise to the solution at room temperature. After the completion of dropwise addition, stirring was continued for 10 hours. The reaction solution was poured into a large volume of 0.1N aqueous hydrochloric acid whereupon the resin precipitated. The resin was recovered and dried in a vacuum dryer, collecting 115 g of the end photosensitive resin (A).

Example 1

In 60 g of ethoxyethyl acetate were dissolved 35 g of the novolac resin (A) which had been partially 1,2-naphthoquinone-2-diazido-5-sulfinyl esterified in the above Preparation Example, 5 g of an epoxy compound (B) of the structural formula (3) shown below, and 0.01 g of a fluorochemical surfactant Florinate FC-430 (3M-Sumitomo Co., Ltd.). The solution was passed through a 0.2 μm filter, obtaining a photosensitive composition.

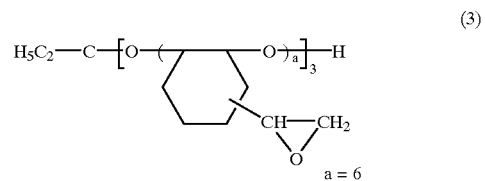

(3)

The composition was spin coated onto a silicon wafer and prebaked on a hot plate at 100° C. for 120 seconds, forming a coating of 3 μm thick. The coating was exposed to radiation using a g-line stepper NSR-1505G2A (Nikon Corp.) and developed with a 2.38% aqueous solution of tetramethylammonium hydroxide. The exposure was 300 mJ/cm$^2$, and a stripe pattern of 0.8 μm could be formed.

A 10 μm stripe pattern was formed on a wafer by the same procedure as above and heated on a hot plate at 150° C. for 5 minutes. At the end of heating, the shape of the pattern remained substantially unchanged. Thereafter, the wafer was heated up to 200° C., finding that the pattern shape remained substantially unchanged.

The pattern thus heat treated was immersed in methyl ethyl ketone or 2-propanol at room temperature for 10 minutes. Neither dissolution nor cracks were observed.

Examples 2–5

Photosensitive compositions were prepared as in Example 1 except that the epoxy compound was changed as shown in Table 1. They were similarly examined, with the results shown in Table 1. The epoxy compound used herein is of above formula (2) wherein X, Y, a, b and c are identified in Table 1 and d=0.

TABLE 1

| Example | X | Y | a | b | c | Addition amount** (g) | Exposure (mJ/cm$^2$) | L/S (μm) | Crack |
|---|---|---|---|---|---|---|---|---|---|
| 2 | C$_2$H$_5$ | cyclohexyl | 6 | 1 | 3 | 5 (14.3 parts) | 300 | ~0.8 | none |
| 3 | CH$_3$ | cyclopentyl | 5 | 1 | 3 | 3.5 (10 parts) | 270 | ~0.8 | none |
| 4 | n-C$_3$H$_7$ | —CH$_2$—CH— | 8 | 2 | 2 | 6.5 (18.6 parts) | 400 | ~1.0 | none |
| 5 | C$_2$H$_5$ | phenyl | 4 | 1 | 3 | 6 (17.1 parts) | 370 | ~0.9 | none |
| 6* | C$_2$H$_5$ | cyclohexyl | 6 | 1 | 3 | 3 (8.6 parts) | 350 | ~0.8 | none |
|  | C$_2$H$_5$ | phenyl | 4 | 1 | 3 | 2 (5.7 parts) |  |  |  |

*mixed system
**The addition amount of the epoxy compound is per 35 g of the novolac resin (A). The amount per 100 parts by weight of the novolac resin (A) is expressed by parts by weight in parentheses.

Japanese Patent Application No. 2000-037369 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A heat-curable photosensitive composition comprising 100 parts by weight of a resin comprising recurring units of the following general structural formula (1) and having a weight average molecular weight of 1,000 to 10,000, 5 to 30 parts by weight of an epoxy compound of the following general structural formula (2), and a solvent therefor,

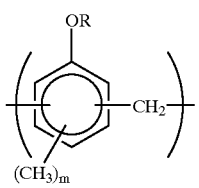

(1)

wherein R is hydrogen or a 1,2-naphthoquinonediazido-4- or 5-sulfonate residue, the proportion of the sulfonate residue being 2.5 to 27 mol % of the R groups, m is an integer of 0 to 3,

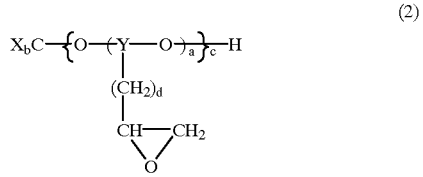

(2)

wherein X is hydrogen or an alkyl group of 1 to 6 carbon atoms, Y is a trivalent chainlike or cyclic aliphatic group of 1 to 6 carbon atoms or trivalent aromatic group of 6 to 9 carbon atoms, the letter a is a positive number of 1 to 20, each of b and c is a positive number of 1 to 3, b+c is equal to 4, and d is a number of 0 to 3.

* * * * *